United States Patent
Hsieh et al.

(10) Patent No.: US 10,798,833 B1
(45) Date of Patent: Oct. 6, 2020

(54) TILING DISPLAY APPARATUS AND METHOD OF FABRICATING THE SAME

(71) Applicant: Au Optronics Corporation, Hsinchu (TW)

(72) Inventors: Meng-Ting Hsieh, Hsinchu (TW); Chih-Hsiang Yang, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 16/594,095

(22) Filed: Oct. 7, 2019

(30) Foreign Application Priority Data

May 13, 2019 (TW) .............................. 108116479 A

(51) Int. Cl.
*G06F 7/04* (2006.01)
*H05K 5/00* (2006.01)
*G02F 1/1333* (2006.01)
*H05K 1/18* (2006.01)
*G02F 1/1345* (2006.01)

(52) U.S. Cl.
CPC ....... *H05K 5/0021* (2013.01); *G02F 1/13336* (2013.01); *G02F 1/13452* (2013.01); *G02F 1/133351* (2013.01); *H05K 1/189* (2013.01); *H05K 5/0017* (2013.01); *H05K 2201/10136* (2013.01)

(58) Field of Classification Search
CPC ........................................................ G06F 7/04
See application file for complete search history.

(56) References Cited

U.S. PATENT DOCUMENTS

2014/0144056 A1* 5/2014 Durant ..................... A47G 1/06
40/768
2017/0084208 A1* 3/2017 Durant ..................... G09F 7/18

FOREIGN PATENT DOCUMENTS

| CN | 201803318 | 4/2011 |
| CN | 102968931 | 3/2013 |
| CN | 104599605 | 5/2015 |
| CN | 102968932 | 6/2015 |
| CN | 107067988 | 8/2017 |
| TW | 201539405 | 10/2015 |

* cited by examiner

Primary Examiner — Jerry Wu
(74) Attorney, Agent, or Firm — JCIPRNET

(57) ABSTRACT

A tiling display apparatus includes a first sub-display portion and a second sub-display portion, and each has a first subsidiary side and a second subsidiary side connected to and perpendicular to the first subsidiary side. Each of the first subsidiary sides of the first sub-display portion and the second sub-display portion is disposed with a first driving circuit. Each of the second subsidiary sides of the first sub-display portion and the second sub-display portion is disposed with a second driving circuit. The first subsidiary side or/and the second subsidiary side of each of the first sub-display portions does not belong to an outer contour of the tiling display apparatus, the first subsidiary side or/and the second subsidiary side of the second sub-display portion does not belong to an outer contour of the tiling display apparatus, and the first subsidiary side of the first sub-display portion is spliced to the first subsidiary side of the second sub-display portion. A method of fabricating the tiling display apparatus is also provided.

14 Claims, 12 Drawing Sheets

TILING DISPLAY APPARATUS AND METHOD OF FABRICATING THE SAME

CROSS-REFERENCE TO RELATED APPLICATION

This application claims the priority benefit of Taiwan application serial no. 108116479, filed on May 13, 2019. The entirety of the above-mentioned patent application is hereby incorporated by reference herein and made a part of this specification.

BACKGROUND

Field of the Invention

The invention relates to a display apparatus and a method of fabricating the same. More particularly, the invention relates to a tiling display apparatus and a method of fabricating the same.

Description of Related Art

As applications of display apparatuses have gradually become diversified, display panels having specifications required for satisfying various usage scenarios have been designed and become development normal conditions of relevant manufacturers. Among the applications, electronic boards for displaying information to the public, such as advertisement billboards on the street, information billboards in department stores and malls, or even message display boards in buses and the MRT, use display panels that not only meet requirements for environment endurance, but also afford for increasing demands for appearance designs. Therefore, a free-form cutting technique of the display panels has become a necessary fabricating technique of the relevant manufacturers. Nevertheless, free-form displays using such kind of cutting technique are limited by process limits of cutting machines and thus, have limited options in sizes and cutting shapes. On the other hand, during a free-form cutting process, a circuit damage or electrical short may likely occur to circuits inside a display panel and so cause damages. Thus, the display panels using the free-form cutting technique cost more manufacturing costs.

SUMMARY

The invention provides a tiling display apparatus with preferable design margin and advantage in costs.

The invention provides a method of fabricating a tiling display apparatus, which has a higher production yield and lower manufacturing costs.

A tiling display apparatus of an embodiment of the invention includes a first sub-display portion, a second sub-display portion, a plurality of first driving circuits and a plurality of second driving circuits. Each of the first sub-display portion and the second sub-display portion has a first subsidiary side and a second subsidiary side connected to and perpendicular to the first subsidiary side. The first subsidiary side or/and the second subsidiary side of the first sub-display portion does not belong to an outer contour of the tiling display apparatus. The first subsidiary side or/and the second subsidiary side of the second sub-display portion does not belong to the outer contour of the tiling display apparatus. The first subsidiary side of the first sub-display portion is spliced to the first subsidiary side of the second sub-display portion. The first driving circuits are respectively disposed on the first subsidiary side of the first sub-display portion and the first subsidiary side of the second sub-display portion. The second driving circuits are respectively disposed on the second subsidiary side of the first sub-display portion and the second subsidiary side of the second sub-display portion.

A method of fabricating a tiling display apparatus of an embodiment of the invention includes the following steps. At least one display panel is cut to form a first sub-display portion and a second sub-display portion, wherein each of the first sub-display portion and the second sub-display portion has a first subsidiary side and a second subsidiary side connected to and perpendicular to the first subsidiary side. A splicing step is performed, which includes splicing the first subsidiary side of the first sub-display portion to the first subsidiary side of the second sub-display portion, wherein the first subsidiary side of the first sub-display portion is disposed with a first driving circuit, the first subsidiary side of the second sub-display portion is disposed with another first driving circuit, the second subsidiary side of the first sub-display portion is disposed with a second driving circuit, and the second subsidiary side of the second sub-display portion is disposed with another second driving circuit.

One of the objects of the invention is to achieve a great diversity of options in sizes and outer contours of the tiling display apparatus through a splicing relation between the first sub-display portion and the second sub-display portion.

One of the objects of the invention is to enable the first sub-display portion and the second sub-display portion to be driven individually with the first sub-display portion and the second sub-display portion disposed with the first driving circuits and the second driving circuits, which can contribute to increasing a degree of splicing freedom, so as to improve the appearance design margin of the tiling display apparatus.

One of the objects of the invention is to perform replacement on only the sub-display portion that fails to be enabled during the maintenance of the tiling display apparatus, thereby improving convenience of the maintenance and reducing maintenance costs.

One of the objects of the invention is to reduce a total length of the cutting paths of the display panel, so as to mitigate a risk that the circuit damage or electrical short occurs to the first sub-display portion and the second sub-display portion, which can contribute to enhancing the production yield of the tiling display apparatus.

To make the above features and advantages of the invention more comprehensible, embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1A:
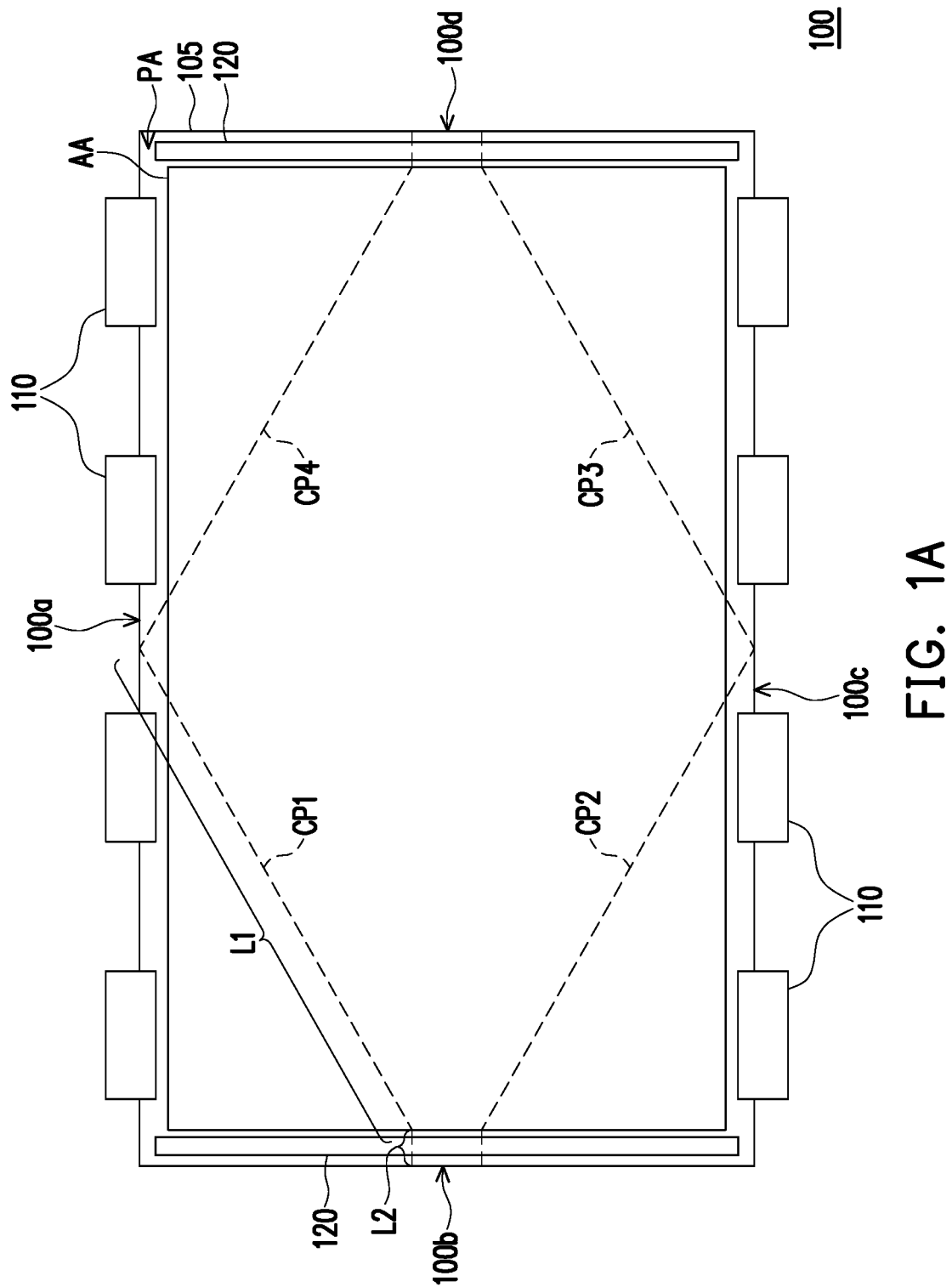
FIG. 1A through FIG. 1D are schematic diagrams illustrating a process of fabricating a tiling display apparatus according to a first embodiment of the invention.

The term "about," "approximately," "essentially," or "substantially" as used herein is inclusive of stated values and means within an acceptable range of deviation for the particular values as determined by persons of ordinary skill in the art, considering the measurement in question and the error associated with measurement of the particular quantity (i.e., the limitations of the measurement system). For example, "about" may mean within one or more standard deviations, or within, for example, ±30%, ±20%, ±10%, ±5% of the stated values. Moreover, a relatively acceptable range of deviation or standard deviation may be chosen for the term "about," "approximately," or "substantially" as used herein based on measurement properties, cutting properties or other properties, instead of applying one standard deviation across all the properties.

In the accompanying drawings, thicknesses of layers, films, panels, regions and so on are exaggerated for clarity. It should be understood that, when an element such as a layer, film, region, or substrate is referred to as being "on" another element or "connected to" another element, the element may be directly on the other element or connected to the other element, or an intermediate element may be provided between the two. In contrast, when an element is referred to as being "directly on" or "directly connected to" another element, there are no intervening elements present. As used in the present specification, "connected" may refer to being physically and/or electrically connected. Besides, the term "electrically connected to" may refer to other elements existing between two elements.

Moreover, relative terms such as "under" or "bottom" and "above" or "top" may be used for describing a relationship of one element and another element as that shown in figures. It should be noted that the relative terms are intended to include a different orientation of the apparatus besides the orientation shown in the figure. For example, if an apparatus in a figure is turned over, the element originally described to be located "under" other element is oriented to be located "above" the other element. Therefore, the illustrative term "under" may include orientations of "under" and "on", which is determined by the specific orientation of the figure. Similarly, if an apparatus in a figure is turned over, the element originally described to be located "below" or "underneath" other element is oriented to be located "above" the other element. Therefore, the illustrative term "under" or "below" may include orientations of "above" and "under".

Reference will now be made in detail to the exemplary embodiments of the invention, examples of which are illustrated in the accompanying drawings. Wherever possible, the same reference numbers are used in the drawings and the description to refer to the same or like parts.

Figure 1B:
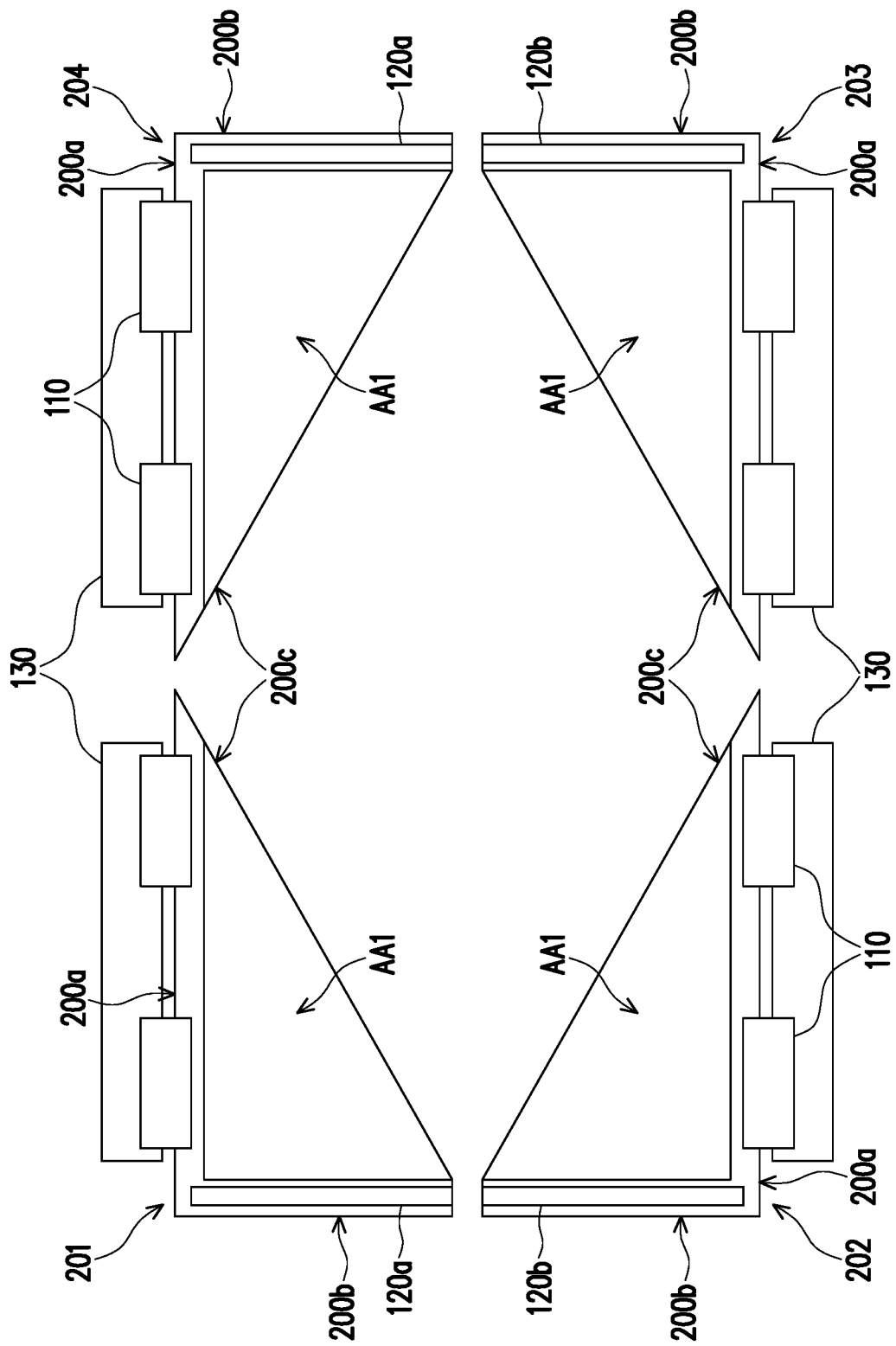
Figure 1C:
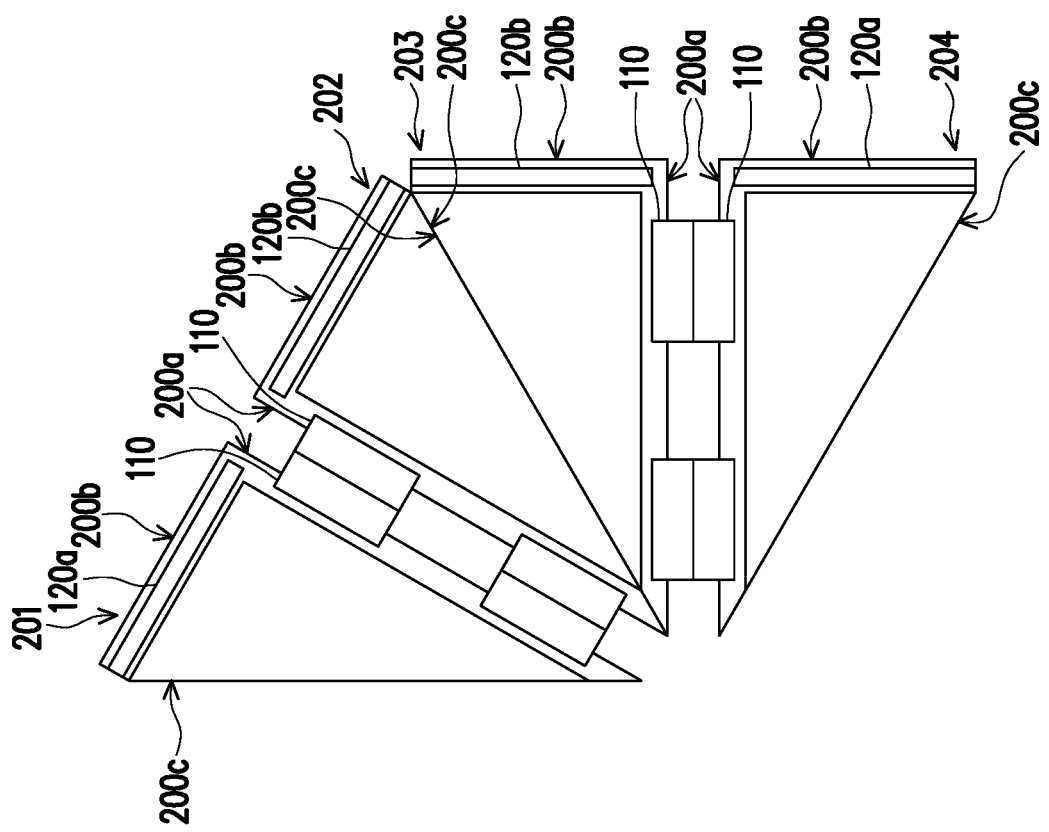

FIG. 1A through FIG. 1D are schematic diagrams illustrating a process of fabricating a tiling display apparatus according to a first embodiment of the invention. FIG. 2 is a schematic cross-sectional diagram corresponding to the tiling display apparatus depicted in FIG. 1D along a section line A-A'. It should be mentioned that for clear illustration, a part of elements of FIG. 2 is omitted from FIG. 1A through FIG. 1C, and a driving circuit board 130 of FIG. 1B is also omitted from FIG. 1C.

Figure 1D:
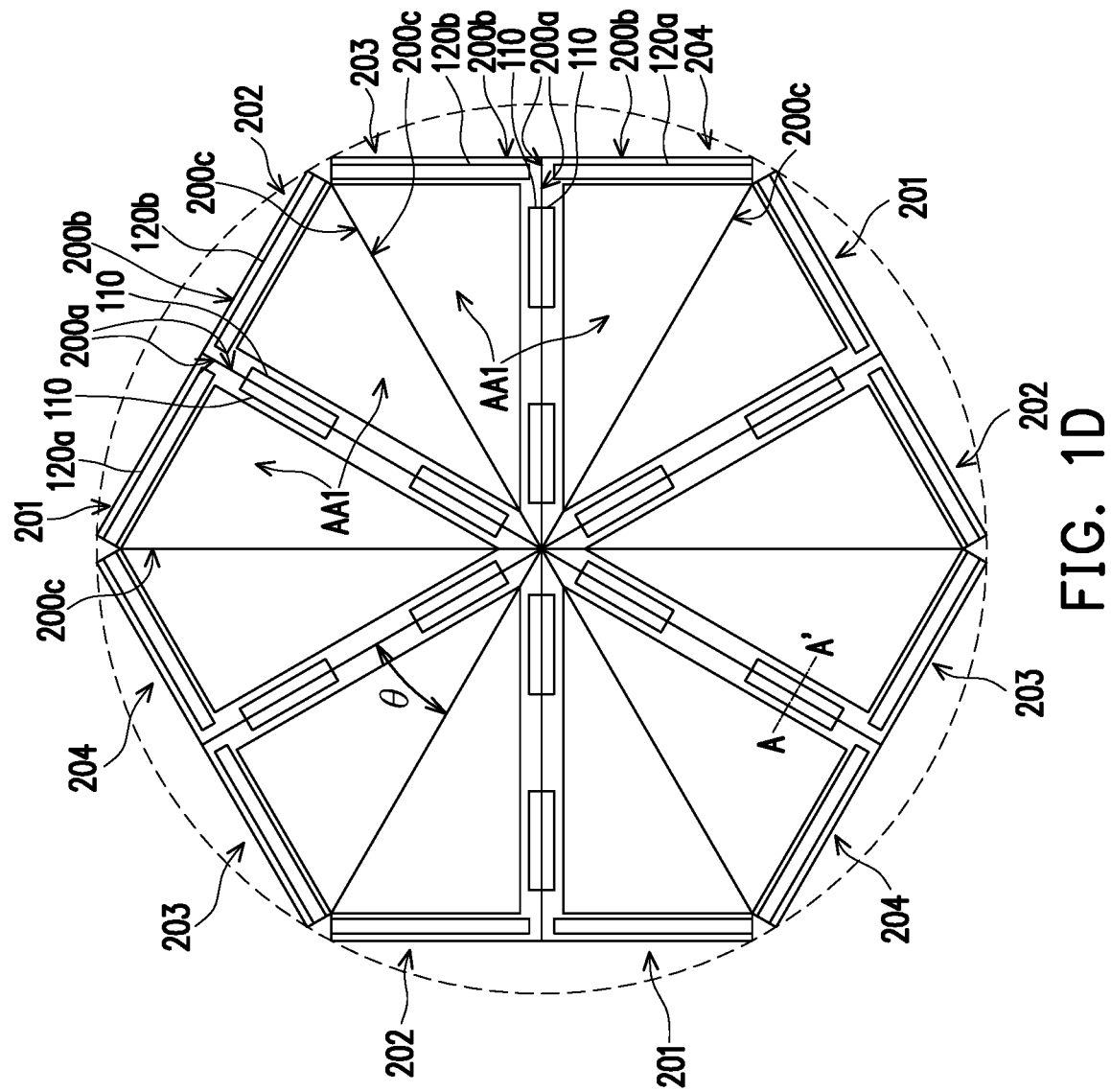
Figure 2:
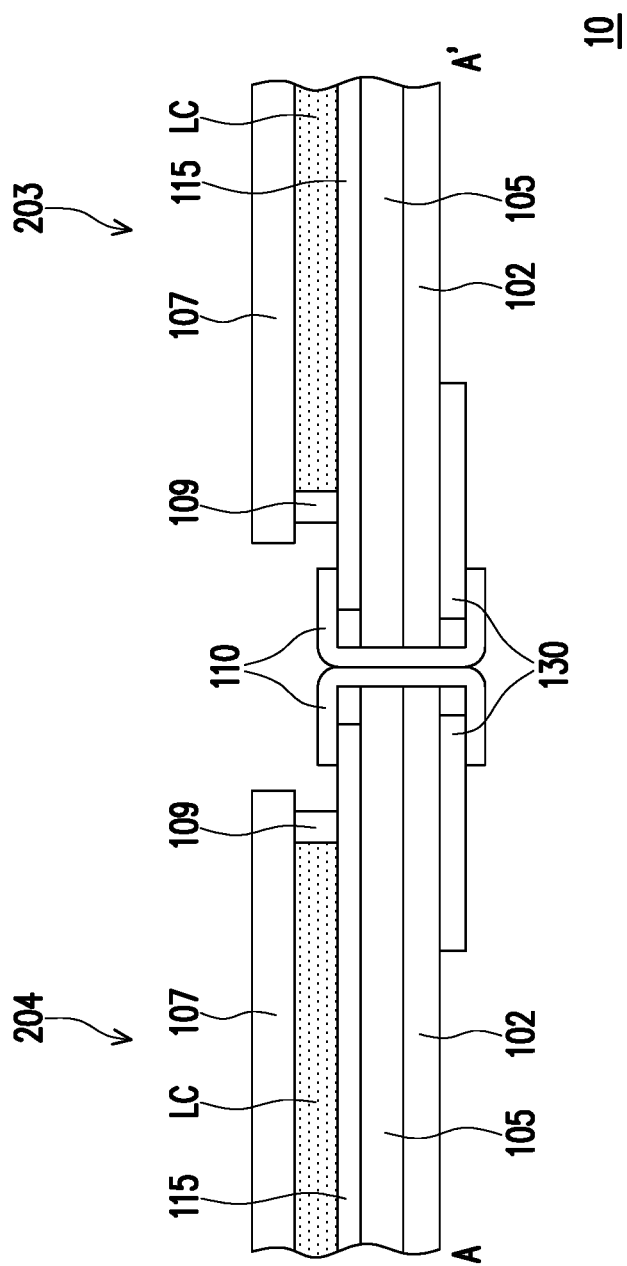
FIG. 2 is a schematic cross-sectional diagram corresponding to the tiling display apparatus depicted in FIG. 1D along a section line A-A'.

Referring to FIG. 1D, a tiling display apparatus 10 includes a plurality of first sub-display portions 201, a plurality of second sub-display portions 202, a plurality of third sub-display portions 203 and a plurality of fourth sub-display portions 204. The first sub-display portions 201, the second sub-display portions 202, the third sub-display portions 203 and the fourth sub-display portions 204 are, for example, arranged in sequence around an arc direction. Each of the first sub-display portion 201, the second sub-display portion 202, the third sub-display portion 203 and the fourth sub-display portion 204 has a sub-active area AA1, a first subsidiary side 200a, a second subsidiary side 200b and a cutting edge 200c. The first subsidiary side 200a is connected to the second subsidiary side 200b, and an extension direction of the first subsidiary side 200a is perpendicular to an extension direction of the second subsidiary side 200b. Namely, the first subsidiary side 200a and the second subsidiary side 200b have an included angle of 90 degrees therebetween. In the present embodiment, in each of the first to the fourth sub-display portions 201-204, the cutting edge 200c may be selectively connected between the first subsidiary side 200a and the second subsidiary side 200b. Specifically, an end of the cutting edge 200c is connected to an end of the first subsidiary side 200a, the other end of the cutting edge 200c is connected to an end of the second subsidiary side 200b, and the first subsidiary side 200a, the second subsidiary side 200b and the cutting edge 200c surround the sub-active area AA1. More specifically, an outer contour of each of the first to the fourth sub-display portions 201-204 (or the sub-active area AA1) substantially may be a (right) triangular shape, the first subsidiary side 200a and the second subsidiary side 200b constitute a right angle, and the cutting edge 200c is greater than the first subsidiary side 200a and is greater than the second subsidiary side 200b, but the invention is not limited thereto.

It is to be specially mentioned that the tiling display apparatus 10 is formed by splicing the plurality of first sub-display portions 201, the plurality of second sub-display portions 202, the plurality of third sub-display portions 203 and the plurality of fourth sub-display portions 204. In the present embodiment, the tiling display apparatus 10 including three first sub-display portions 201, three second sub-display portions 202, three third sub-display portions 203 and three fourth sub-display portions 204 is taken as an example for exemplary illustration, and the tiling display apparatus 10 may have an hexagonal outer contour according to a splicing relation among the three first sub-display portions 201, the three second sub-display portions 202, the three third sub-display portions 203 and the three fourth sub-display portions 204. Nevertheless, the invention is not limited thereto. In other embodiments, a display apparatus substantially having a quadrilateral or octagonal shape may also be formed by splicing the first sub-display portions 202, the second sub-display portions 202, the third sub-display portions 203 and the four sub-display portions 204. For example, a display apparatus substantially having a triangular or quadrilateral shape may be formed by splicing a first sub-display portion 201 and a second sub-display portion 202, and a display apparatus substantially having a triangular or quadrilateral shape may be formed by splicing a third sub-display portion 203 and a fourth sub-display portion 204. In other words, a design margin of the tiling display apparatus 10 in its size and appearance contour may be increased through a degree of freedom of splicing the first sub-display portions 201, the second sub-display portions 202, the third sub-display portions 203 and the fourth sub-display portions 204. A process of fabricating the tiling display apparatus 10 will be described hereinafter.

First, at least one a display panel 100 is provided, as illustrated in FIG. 1A. The display panel 100 has an active area AA, a plurality of sides surrounding the active area AA and a peripheral area PA disposed between the sides and the active area AA. In the present embodiment, the sides of the display panel 100 include, for example, a first side 100a, a second side 100b, a third side 100c and a fourth side 100d, wherein the first side 100a and the third side 100c which are opposite to each other are connected to the second side 100b and the fourth side 100d which are opposite to each other, and extension directions of the first side 100a and the third side 100c may be perpendicular to extension directions of the second side 100b and the fourth side 100d.

Furthermore, the display panel 100 further has a plurality of first driving circuits 110 and a plurality of second driving circuits 120 disposed on the plurality of sides. For example, the plurality of first driving circuits 110 may include a plurality of flexible circuit boards, and the plurality of second driving circuits 120 may include a plurality of gate driving circuits. In the present embodiment, the numbers of the first driving circuits 110 and the second driving circuits 120 are respectively exemplified as 8 and 2, for example, for illustration, wherein each of the first side 100a and the third side 100c of the display panel 100 is disposed with four first driving circuits 110 (e.g., flexible circuit boards), and each of the second side 100b and the fourth side 100d is disposed with a second driving circuit 120, wherein each of the second driving circuits 120 is, for example, a gate driver-on-array (GOA) circuit or a gate driver IC, but the invention is not limited thereto. In some embodiments, each of the second side 100b and the fourth side 100d of the display panel 100 may also be disposed with a plurality of first driving circuits 110, and each of the first driving circuits 110 may include a flexible circuit board having a gate and/or source driving circuit or a chip on film (COF) package, but the invention is not limited thereto.

Referring to FIG. 1A and FIG. 1B, the display panel 100 is cut. Namely, the display panel 100 is cut along at least one cutting path, thereby forming at least one corresponding sub-display portion. In the present embodiment, the display panel 100 is cut along a first cutting path CP1, a second cutting path CP2, a third cutting path CP3 and a fourth cutting path CP4, thereby forming a first sub-display portion 201, a second sub-display portion 202, a third sub-display portion 203 and a fourth sub-display portion 204, respectively.

For example, the first cutting path CP1 may intersect the first side 100a and the second side 100b, the second cutting path CP2 may intersect the second side 100b and the third side 100c, the third cutting path CP3 may intersect the third side 100c and the fourth side 100d, and the fourth cutting path CP4 may intersect the fourth side 100d and the first side 100a. In this way, a total length of the cutting paths of the display panel 100 may be reduced, so as to mitigate a risk that a circuit damage or electrical short occurs to the first sub-display portion 201, the second sub-display portion 202, the third sub-display portion 203 and the fourth sub-display portion 204, which may contribute to enhancing a production yield of the tiling display apparatus 10.

In the present embodiment, each of the first cutting path CP1, the second cutting path CP2, the third cutting path CP3 and the fourth cutting path CP4 of the display panel 100 may include straight line segments L1 and L2. The straight line segments L1 and L2 are not parallel to each other, the straight line segments L1 are not parallel to the first to the fourth sides 100a-100d and overlap with the active area AA, instead of overlapping the second driving circuits 120, and the straight line segments L2 are parallel to the first side 100a and the third side 100c and overlap with the second driving circuits 120, but the invention is not limited thereto. In other embodiments, each of the cutting paths may also have a single straight line segment or three straight line segments or more. It is to be specially mentioned that in the present embodiment, the first cutting path CP1, the second cutting path CP2, the third cutting path CP3 and the fourth cutting path CP4 may respectively define the cutting edges 200c of the first sub-display portion 201, the second sub-display portion 202, the third sub-display portion 203 and the fourth sub-display portion 204. It should be mentioned that in the present embodiment, the number of the cutting paths is exemplified as four as an example for illustration, but the invention is not limited thereto. In other embodiments, the number of the cutting paths may be adjusted according to the numbers, sizes or shapes of the sub-display portions which are to be cut. For example, one, two, three or four of the first sub-display portion 201, the second sub-display portion 202, the third sub-display portion 203 and the four sub-display portion 204 may respectively belong to different display panels.

It should be specially mentioned that the first subsidiary side 200a and the second subsidiary side 200b of one of the sub-display portions (e.g., the first sub-display portion 201) actually are respectively a part of one of the sides (e.g., the first side 100a) and a part of another side (e.g., the second side 100b) of the display panel 100. Therefore, each of the four sub-display portions formed after the display panel 100 is cut includes parts of the first driving circuits 110 and of the second driving circuits 120. For example, after the display panel 100 is cut, each of the second driving circuits 120 may be cut into two different two parts (e.g., including a second driving circuit 120a and a second driving circuit 120b), the first subsidiary side 200a of the first sub-display portion 201 may be disposed with two first driving circuits 110, and the second subsidiary side 200b may be disposed with the second driving circuit 120a. The first subsidiary side 200a of the second sub-display portion 202 may be disposed with two first driving circuits 110, and the second subsidiary side 200b may be disposed with the second driving circuit 120b. By deducing analogously, the third sub-display portion 203 and the fourth sub-display portion 204 may also have similar disposition relation and thus, will not be repeatedly described. In other words, because each sub-display portion is disposed with the driving circuits, i.e., each sub-display portion is capable of being separately driven. Thus, a degree of freedom of splicing the sub-display portions may be increased, so as to improve the appearance design margin of the tiling display apparatus 10.

Furthermore, the method of fabricating the tiling display apparatus 10 may also selectively include a bonding process. Referring to FIG. 1B, the first driving circuits 110 of each sub-display portion may also be selectively bonded to the driving circuit boards 130. In the present embodiment, the first driving circuit 110 is, for example, a transmission circuit board without any driver chip and is configured to transmit driving signals of the driving circuit boards 130 to pixel arrays 115 of the sub-display portions (as illustrated in FIG. 2), for example, transmit the driving signals to the pixel arrays 115 through scan lines (not shown) or data lines (not shown), but the invention is not limited thereto.

Then, a splicing step is performed, such that one of the first subsidiary side 200a, the second subsidiary side 200b and the cutting edge 200c of one of the sub-display portions is spliced to one of the first subsidiary side 200a, the second subsidiary side 200b and the cutting edge 200c of another one of the sub-display portions. Referring to FIG. 1C and FIG. 1D, in the present embodiment, the cutting edge 200c of the second sub-display portion 202 may be spliced to the cutting edge 200c of the third sub-display portion 203. On the other hand, the first subsidiary side 200a of the first sub-display portion 201 which is disposed with the first driving circuits 110 may be spliced to the first subsidiary side 200a of the second sub-display portion 202 which is disposed with the first driving circuits 110. Similarly, the first subsidiary side 200a of the third sub-display portion 203 which is disposed with the first driving circuits 110 may be spliced to the first subsidiary side 200a of the fourth sub-display portion 204 which is disposed with the first driving circuits 110. In other words, at least one first driving circuit 110 is located between the sub-active area AA1 of the first sub-display portion 201 and the sub-active area AA1 of the second sub-display portion 202, at least one first driving circuit 110 is located between the sub-active area AA1 of the third sub-display portion 203 and the sub-active area AA1 of the fourth sub-display portion 204, and there is not any driving circuit between the cutting edge 200c of the second sub-display portion 202 and the cutting edge 200c of the third sub-display portion 203, but the invention is not limited thereto.

It should be mentioned that the splicing relation between any two of the sub-display portions may be achieved through an adhesive material, a bonding structure or other adaptive splicing manners, which is not limited in the invention.

It is to be specially mentioned that during the process of splicing the first sub-display portion 201 and the second sub-display portion 202 (or the third sub-display portion 203 and the fourth sub-display portion 204), the first driving circuit 110 bonded to each of the sub-display portions may be folded from a position above the pixel array 115 to a side of a first substrate 105 which departs away from the pixel array 115 (as illustrated in FIG. 2), thereby minimizing a distance between two sub-active areas AA1 of the first sub-display portion 201 and the second sub-display portion 202 (or the third sub-display portion 203 and the fourth sub-display portion 204), which may contribute to continuity of a display screen. In the present embodiment, the tiling display apparatus 10 may further include a back-light module 102 between the first substrate 105 and the driving circuit board 130, but the invention is not limited thereto. In other embodiments, the display apparatus may also not be disposed with the back-light module, namely, the display panel may be a self-luminous display panel.

According to FIG. 1D, in the present embodiment, to complete the splicing of the tiling display apparatus 10, three first sub-display portions 201, three second sub-display portions 202, three third sub-display portions 203 and three fourth sub-display portions 204 are required. In other words, the fabrication of the tiling display apparatus 10 is completed by performing the cutting step and the splicing step by using three display panels 100.

In the present embodiment, the tiling display apparatus 10 includes a plurality of sub-display portions which are spliced to one another. The first subsidiary side 200a and the second subsidiary side 200b of each of the sub-display portions have an included angle of 90 degrees therebetween, the first subsidiary side 200a of any one of the sub-display portions is spliced to the first subsidiary side 200a of another one of the sub-display portions, and the cutting edge 200c of any one of the sub-display portions is spliced to the cutting edge 200c of another one of the sub-display portions. In the present embodiment, the first subsidiary sides 200a and the cutting edges 200c of the sub-display portions may be located inside the tiling display apparatus 10. Namely, the first subsidiary sides 200a and the cutting edges 200c of the first sub-display portion 201, the second sub-display portion 202, the third sub-display portion 203 and the four sub-display portion 204 do not belong to an outer contour of the tiling display apparatus 10, but the invention is not limited thereto.

On the other hand, the first subsidiary side 200a is disposed with a plurality of first driving circuits 110, and the second subsidiary side 200b is disposed with the second driving circuit 120a (or the second driving circuit 120b). Accordingly, each of the sub-display portions may be separately driven. During maintenance of the tiling display apparatus 10, only the sub-display portion which is damaged (i.e., fails to be enabled) has to be replaced, such that convenience during the maintenance may be improved, and maintenance costs may be reduced. In another viewpoint, the degree of splicing freedom of the sub-display portions may be increased, so as to improve the appearance design margin of the tiling display apparatus 10.

It should be specially mentioned that the size of the tiling display apparatus 10 may be defined according to a diameter of a minimum external circle tangent with the outer contour (as shown by a dotted circle in FIG. 1D). For example, the size of the tiling display apparatus 10 is defined as 100 inches, i.e., the diameter of the dotted circle is 100 inches, wherein a length of the cutting edge 200c of each of the first sub-display portion 201, the second sub-display portion 202, the third sub-display portion 203 and the fourth sub-display portion 204 is about 50 inches. Because an included angle θ between the cutting edge 200c and the first subsidiary side 200a of each of the first sub-display portion 201, the second sub-display portion 202, the third sub-display portion 203 and the fourth sub-display portion 204 is 30 degrees, a length of the first subsidiary sides 200a of the first sub-display portion 201, the second sub-display portion 202, the third sub-display portion 203 and the fourth sub-display portion 204 is about 43.3 inches (which may be calculated by 50×cos(30°)), and a length of the second subsidiary sides 200b is about 25 inches (which may be calculated by 50×sin(30°)). According to FIG. 1A, the size of the display panel 100 which is cut to obtain the first sub-display portion 201, the second sub-display portion 202, the third sub-display portion 203 and the fourth sub-display portion 204 is at least 100 inches or more. In other words, in order to complete the tiling display apparatus 100 having the size of 100 inches and the outer contour of a regular hexagonal shape, at least three 100-inch display panels have to be cut. Nevertheless, since the degree of freedom of splicing the first sub-display portions 201, the second sub-display portions 202, the third sub-display portions 203 and the fourth sub-display portions 204 is high to satisfy various demands on the appearance of the tiling display apparatus, even in different appearance demands, the display panels for being cut do not have to be redesigned, thereby effectively reducing the manufacturing costs (e.g., the expense of process masks).

Referring to FIG. 2, FIG. 2 is a schematic cross-sectional diagram corresponding to the tiling display apparatus depicted in FIG. 1D along a section line A-A'. Each of the third sub-display portion 203 and the fourth sub-display portion 204 includes the first substrate 105, the pixel array 115, a second substrate 107, a liquid crystal layer LC and a sealant 109. The liquid crystal layer LC and the sealant 109 are located between the first substrate 105 and the second substrate 107. The pixel array 115 is disposed on the first substrate 105 and located between the first substrate 105 and the liquid crystal layer LC. In the present embodiment, the first and second substrates 105 and 107 are, for example, glass substrates, quartz substrates, plastic substrates or other substrates made of adaptive materials, and the pixel array 115 may include a plurality of pixels. Namely, the display panel 100 of the present embodiment is, for example, a liquid crystal display (LCD) panel, but the invention is not limited thereto. In other embodiments, the display panel may also be an organic light emitting diode (OLED) panel, a micro light emitting diode (micro LED) panel or a mini light emitting diode (mini LED) panel.

Several other embodiments are provided below to illustrate the invention in detail, wherein the same reference numbers refer to the same parts, the description with respect to the same technical content is omitted, and the omitted parts may be inferred with reference to the description related to the previous embodiment and will not be repeated.

Figure 3:
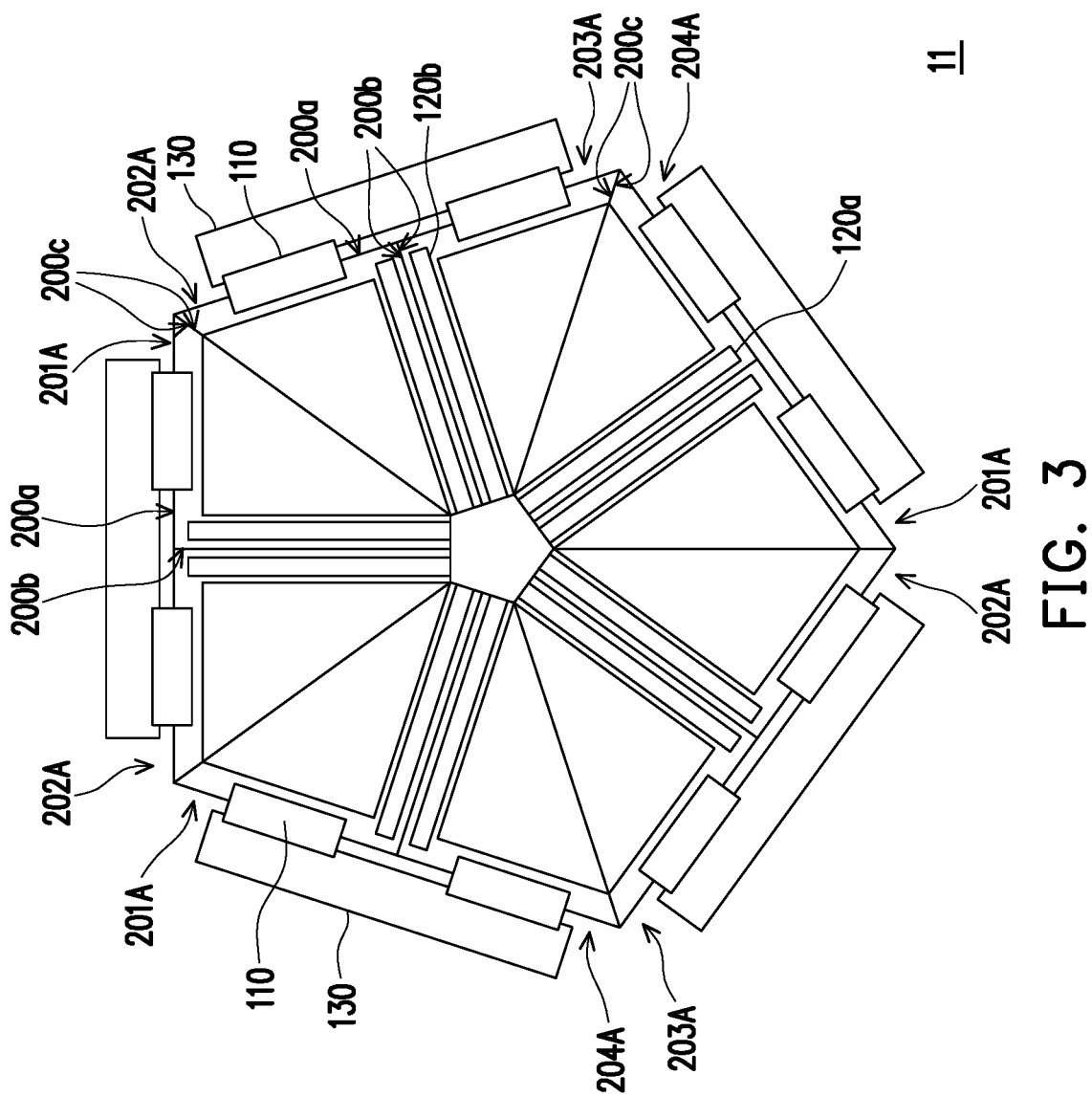
FIG. 3 is a schematic diagram illustrating a tiling display apparatus according to a second embodiment of the invention.

FIG. 3 is a schematic diagram illustrating a tiling display apparatus according to a second embodiment of the invention. Referring to FIG. 3, the main difference between a tiling display apparatus 11 of the present embodiment and the tiling display apparatus 10 illustrated in FIG. 1D lies in that the numbers and the splicing manners of the sub-display portions are different. In the present embodiment, the number of the sub-display portions for forming the tiling display apparatus 11 is ten, and an outer contour of the tiling display apparatus 11 is substantially presented in a pentagonal shape. To be detailed, a second subsidiary side 200b of each second sub-display portion 202A is spliced to the second subsidiary side 200b of each third sub-display portion 203A. On the other hand, a cutting edge 200c of each first sub-display portion 201A is spliced to the cutting edge 200c of each second sub-display portion 202A. Similarly, the cutting edge 200c of each third sub-display portion 203A is spliced to the cutting edge 200c of each fourth sub-display portion 204A.

It is to be specially mentioned that in the present embodiment, the second subsidiary side 200b and the cutting edge 200c of each of the first sub-display portions 201A, the second sub-display portions 202A, the third sub-display portions 203A and the four sub-display portions 204A may be located inside the tiling display apparatus 11. Namely, the second subsidiary side 200b and the cutting edge 200c of each of the first sub-display portions 201A, the second sub-display portions 202A, the third sub-display portions 203A and the four sub-display portions 204A do not belong to the outer contour of the tiling display apparatus 11, but the invention is not limited thereto. On the other hand, the first driving circuits 110 and the driving circuit boards 130 which are bonded to the sub-display portions may be located in the periphery of the tiling display apparatus 11, and the first driving circuits 110 are sequentially arranged in sequence around the outer contour of the tiling display apparatus 11.

Figure 4:
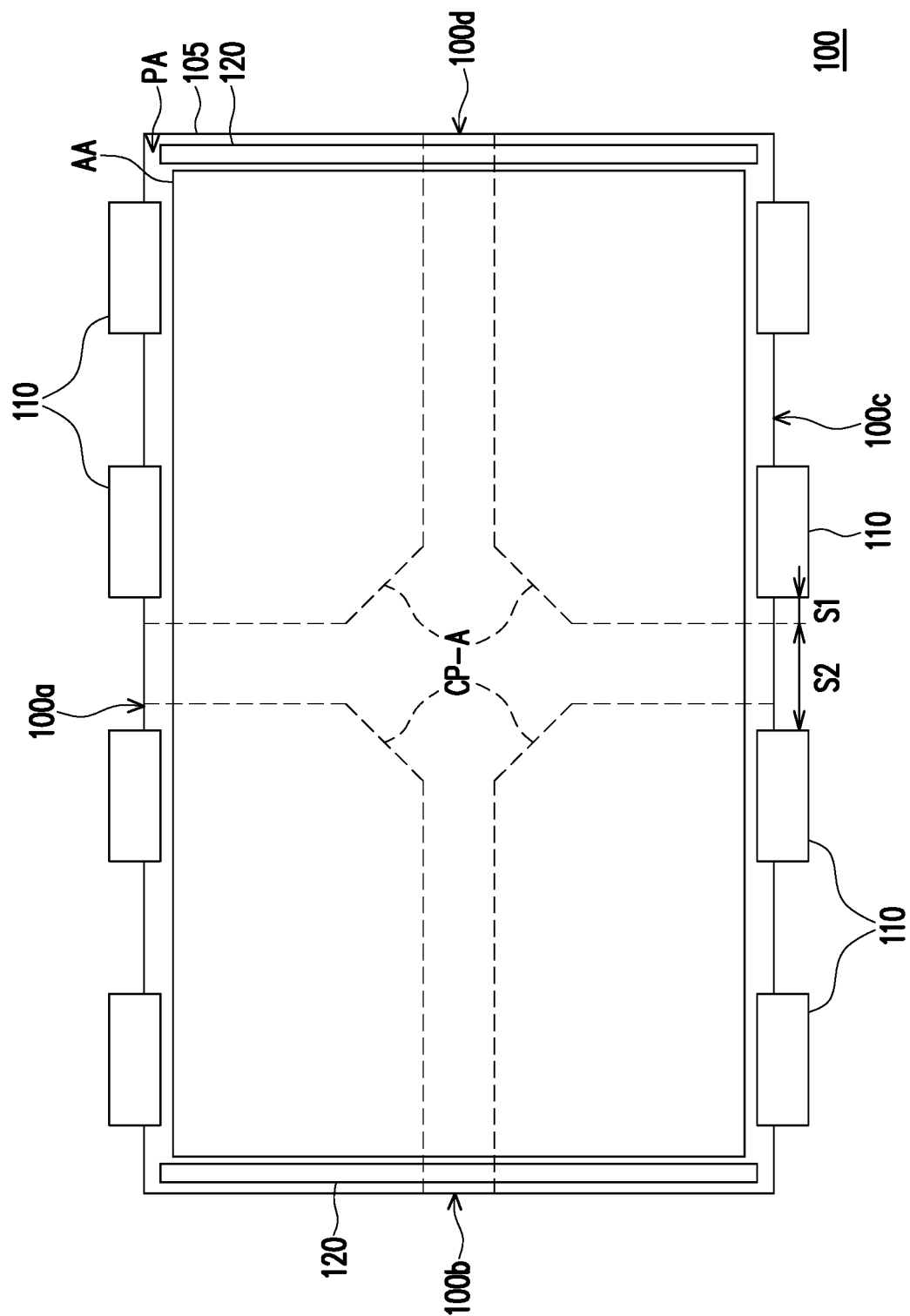
FIG. 4 is a schematic diagram illustrating a display panel which is not cut according to a third embodiment of the invention.
Figure 5:
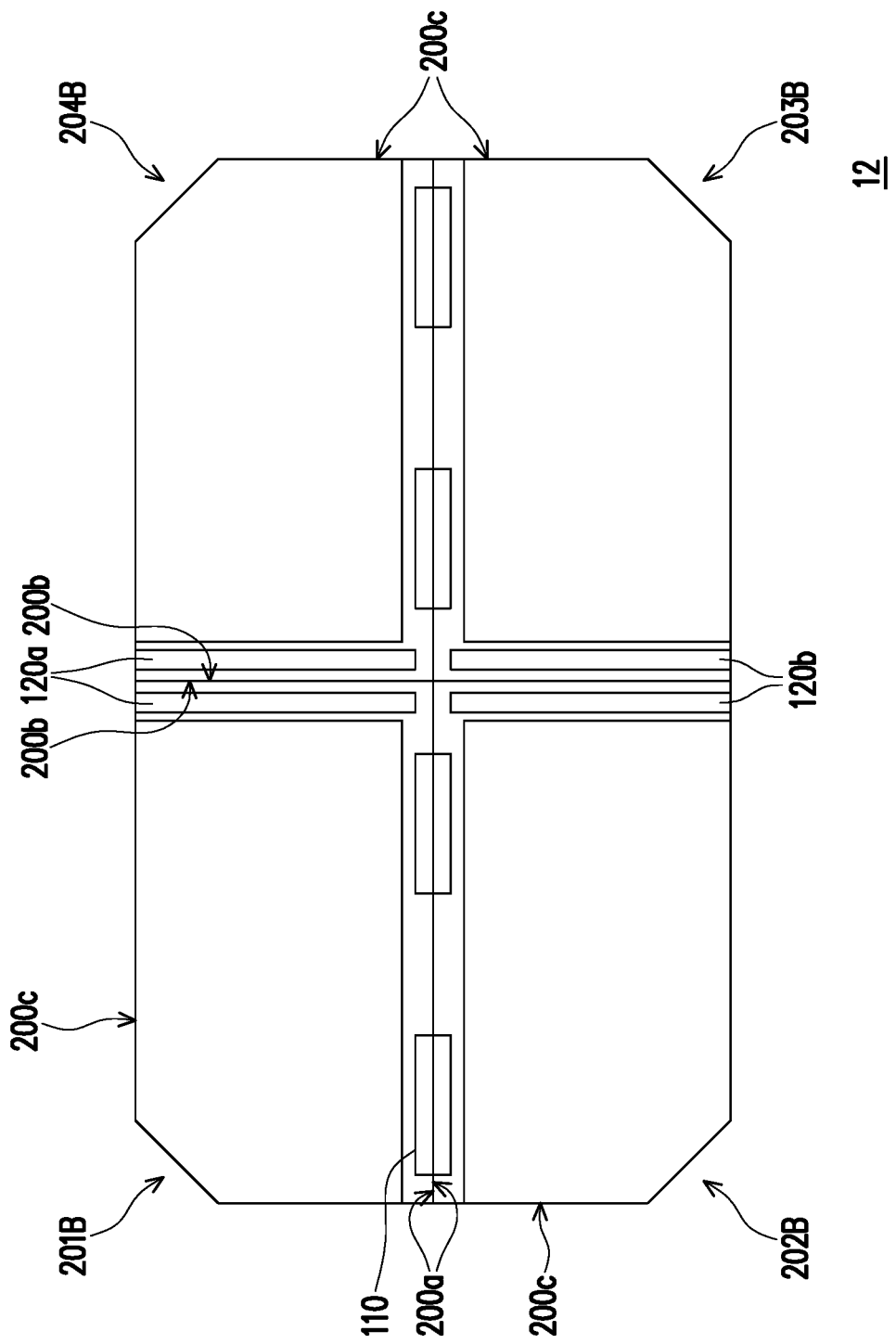
FIG. 5 is a schematic diagram illustrating a tiling display apparatus according to a third embodiment of the invention.

FIG. 4 is a schematic diagram illustrating a display panel which is not cut according to a third embodiment of the invention. FIG. 5 is a schematic diagram illustrating a tiling display apparatus according to a third embodiment of the invention. Referring to FIG. 4 and FIG. 5, the main difference between a tiling display apparatus 12 of the present embodiment and the tiling display apparatus 10 illustrated in FIG. 1D lies in that the numbers, the shapes and the splicing manners of the sub-display portions are different. In the present embodiment, the number of the sub-display portions for forming the tiling display apparatus 12 is four (for example, a first sub-display portion 201B, a second sub-display portion 202B, a third sub-display portion 203B and a fourth sub-display portion 204B), and an outer contour of the tiling display apparatus 12 is presented in an octagonal shape. To be detailed, during a process of fabricating the tiling display apparatus 12, the display panel 100 has four cutting paths CP-A, each of the cutting paths CP-A (or the cutting edges 200c of the sub-display portions) has three straight line segments, each of the sub-display portions 201B, 202B, 203B and 204B is a pentagonal shape, and the first subsidiary side 200a and the second subsidiary side 200b of any one of the sub-display portions (e.g., the first sub-display portion 201B) are respectively spliced to the first subsidiary side 200a of another one of the sub-display portions (e.g., the second sub-display portion 202B) and the second subsidiary side 200b of yet another one of the sub-display portions (e.g., the fourth sub-display portion 204B). It is to be specially mentioned that the cutting edges 200c of the sub-display portions may define the outer contour of the tiling display apparatus 12. The first driving circuits 110 are not located on the outer contour of the tiling display apparatus 12.

Figure 6:
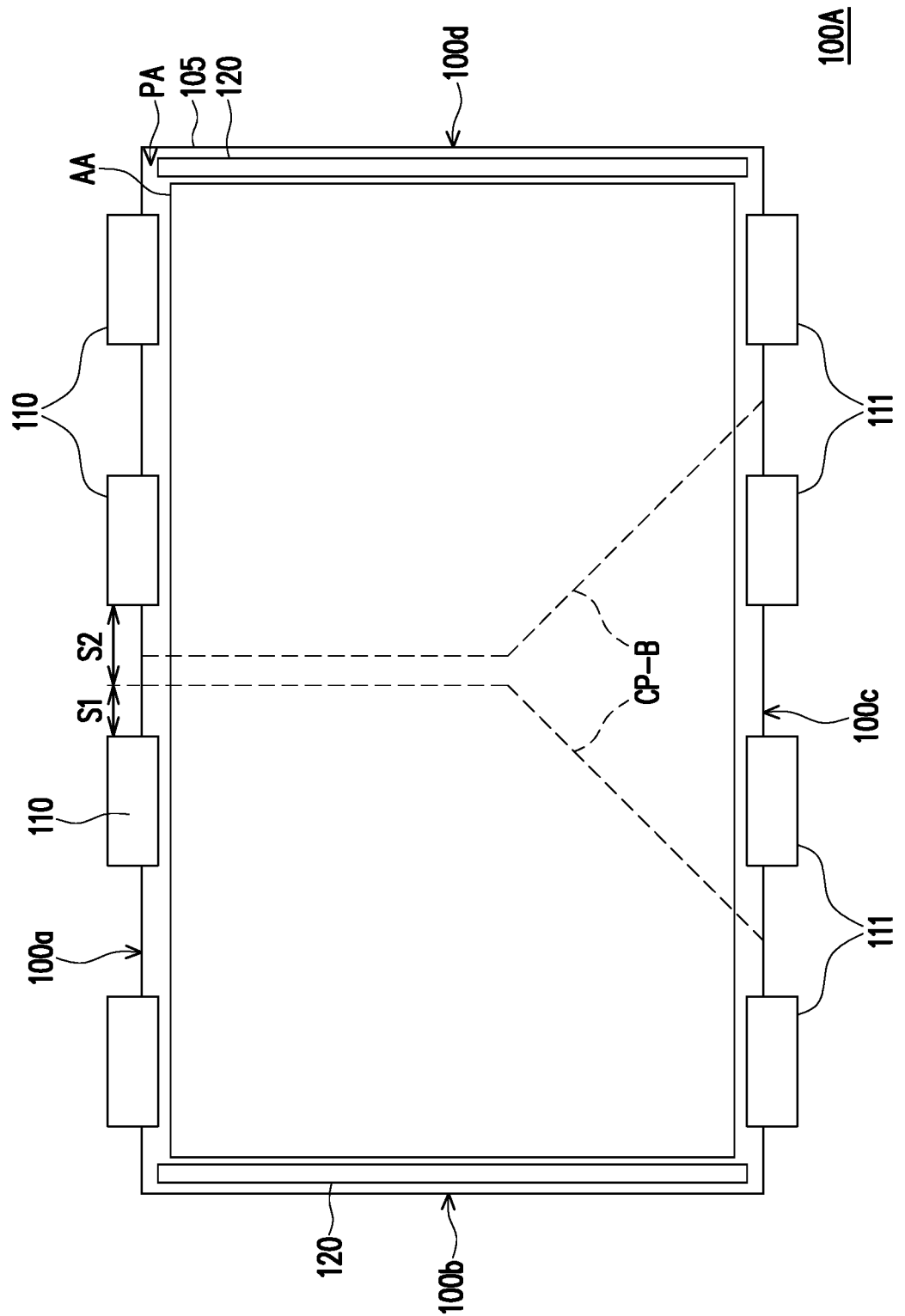
FIG. 6 is a schematic diagram illustrating a display panel which is not cut according to a fourth embodiment of the invention.
Figure 7:
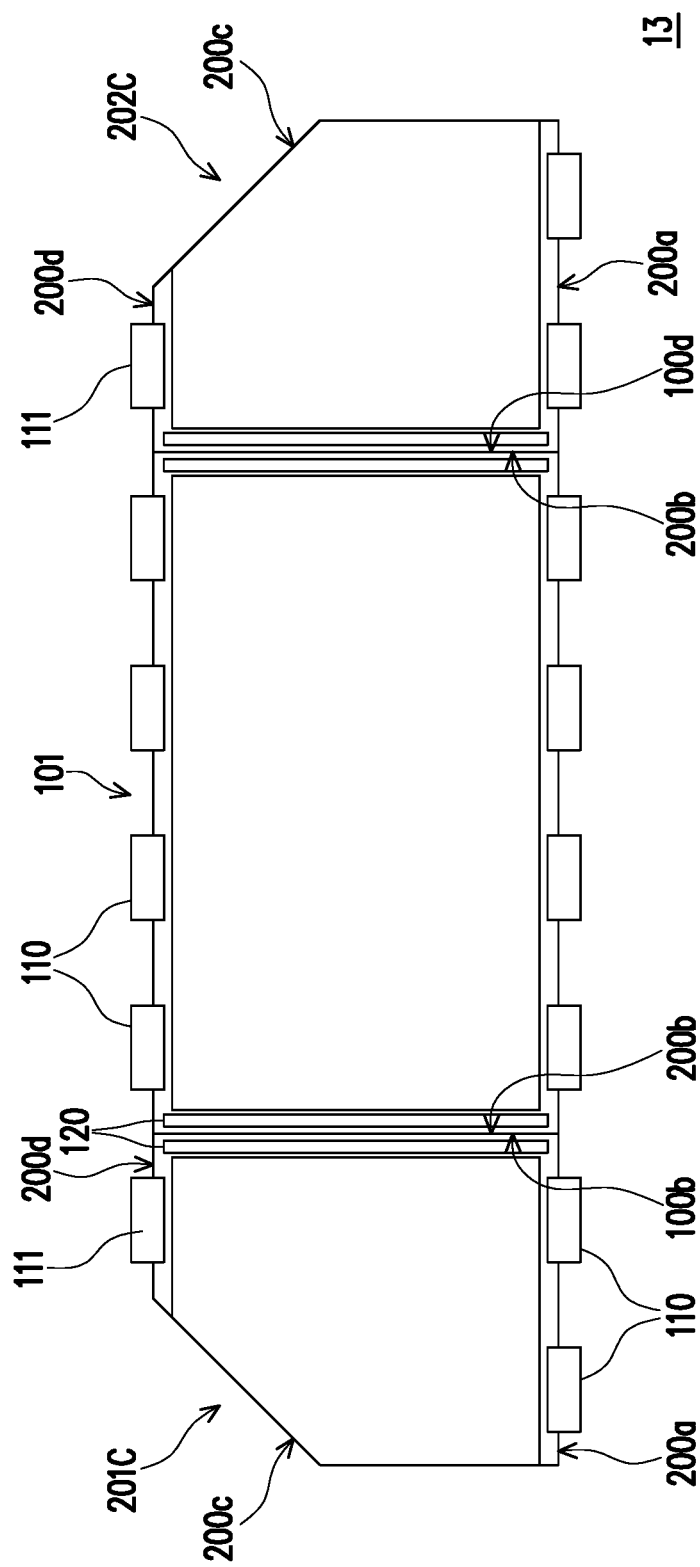
FIG. 7 is a schematic diagram illustrating a tiling display apparatus according to the fourth embodiment of the invention.

FIG. 6 is a schematic diagram illustrating a display panel which is not cut according to a fourth embodiment of the invention. FIG. 7 is a schematic diagram illustrating a tiling display apparatus according to the fourth embodiment of the invention. Referring to FIG. 6 and FIG. 7, the main difference between a tiling display apparatus 13 of the present embodiment and the tiling display apparatus 10 illustrated in FIG. 1D lies in that the numbers, the shapes and the splicing manners of the sub-display portions are different. In the present embodiment, the number of sub-display portions that are formed by cutting the display panel 100A and applied to the tiling display apparatus 13 is two (for example, a first sub-display portion 201C and a second sub-display portion 202C), and an outer contour of the tiling display apparatus 13 is presented in a hexagonal shape. To be detailed, during a process of fabricating the tiling display apparatus 13, the display panel 100A has two cutting paths CP-B, and each of the cutting paths CP-B (or the cutting edges 200c of the sub-display portions) has two straight line segments. In the present embodiment, each of the cutting paths CP-B has a bending line. The cutting paths CP-B intersect the first side 100a and the third side 100c of the display panel 100A. In other words, each of the first sub-display portion 201C and the second sub-display portion 202C has a third subsidiary side 200d connected between the second subsidiary side 200b and the cutting edge 200c. In the present embodiment, the first sub-display portion 201C and the second sub-display portion 202C are respectively pentagonal shapes.

It should be specially mentioned that the third subsidiary side 200d of each of the first sub-display portion 201C and the second sub-display portion 202C is actually a part of one of the sides (e.g., the third side 100c) of the display panel 100A. Therefore, the third subsidiary side 200d of each of the first sub-display portion 201C and the second sub-display portion 202C is also disposed with a third driving circuit 111. In the present embodiment, the tiling display apparatus 13 is formed by splicing the display panel 101, the first sub-display portion 201C and the second sub-display portion 202C, and the display panel 101 may be considered as a sub-display portion which is a rectangular shape. The second subsidiary side 200b of the first sub-display portion 201C is spliced to the second subsidiary side 200b of the display panel 101, and the second subsidiary side 200b of the second sub-display portion 202C is spliced to the fourth subsidiary side 100d of the display panel 101. It can be understood according to FIG. 7 that the first subsidiary side 100a, the cutting edge 200c and the third subsidiary side 200d of the first sub-display portion 201 and the first side 100a and the third side 100c of the display panel 101 may define the outer contour of the tiling display apparatus 13. It is to be mentioned that according to the splicing relation among the first sub-display portion 201C, the second sub-display portion 202C and the display panel 101 which is not cut, the production costs of a large-size tiling display apparatus may be further reduced, and the appearance design margin of the tiling display apparatus may be increased.

Figure 8:
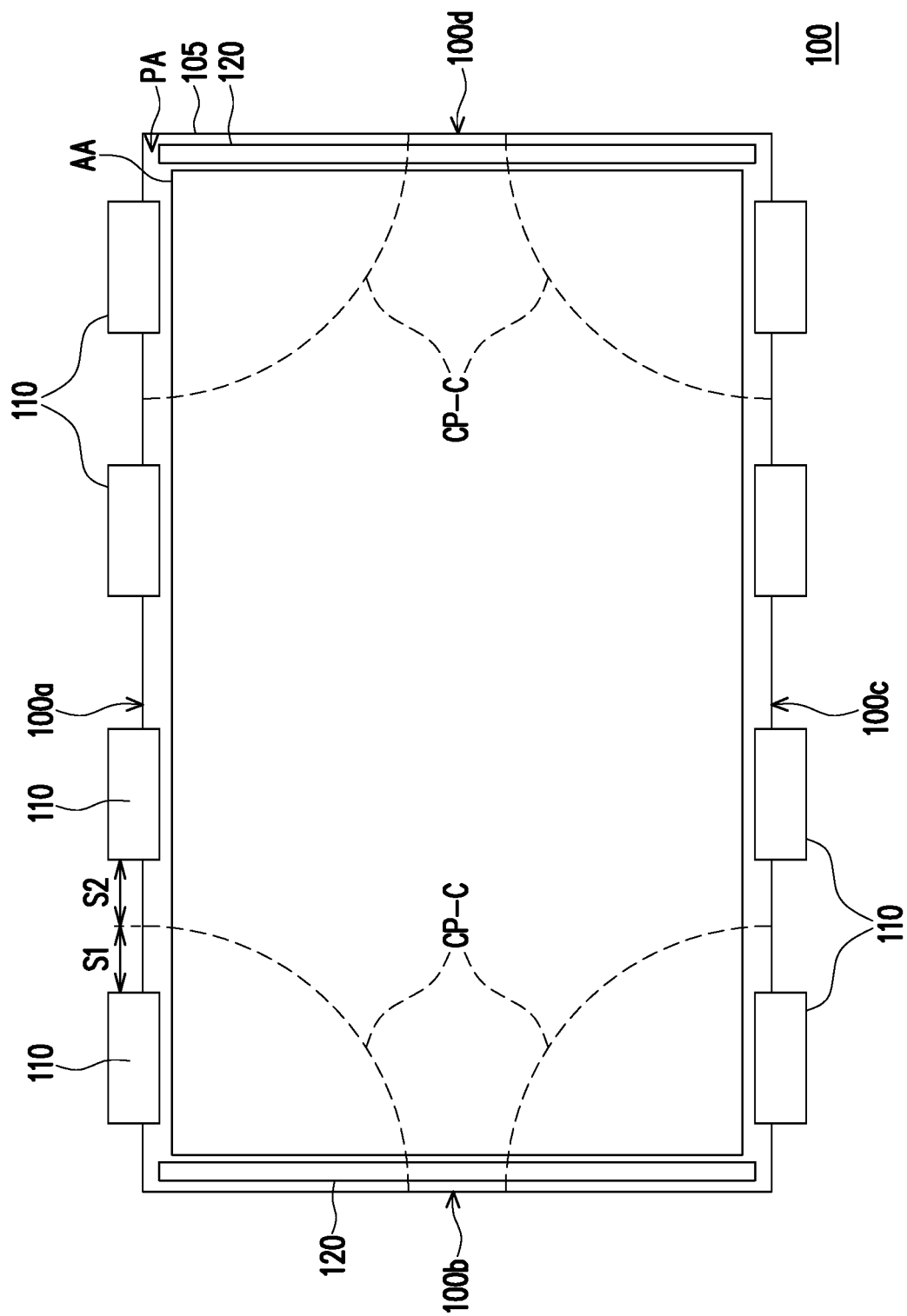
FIG. 8 is a schematic diagram illustrating a display panel which is not cut according to a fifth embodiment of the invention.
Figure 9:
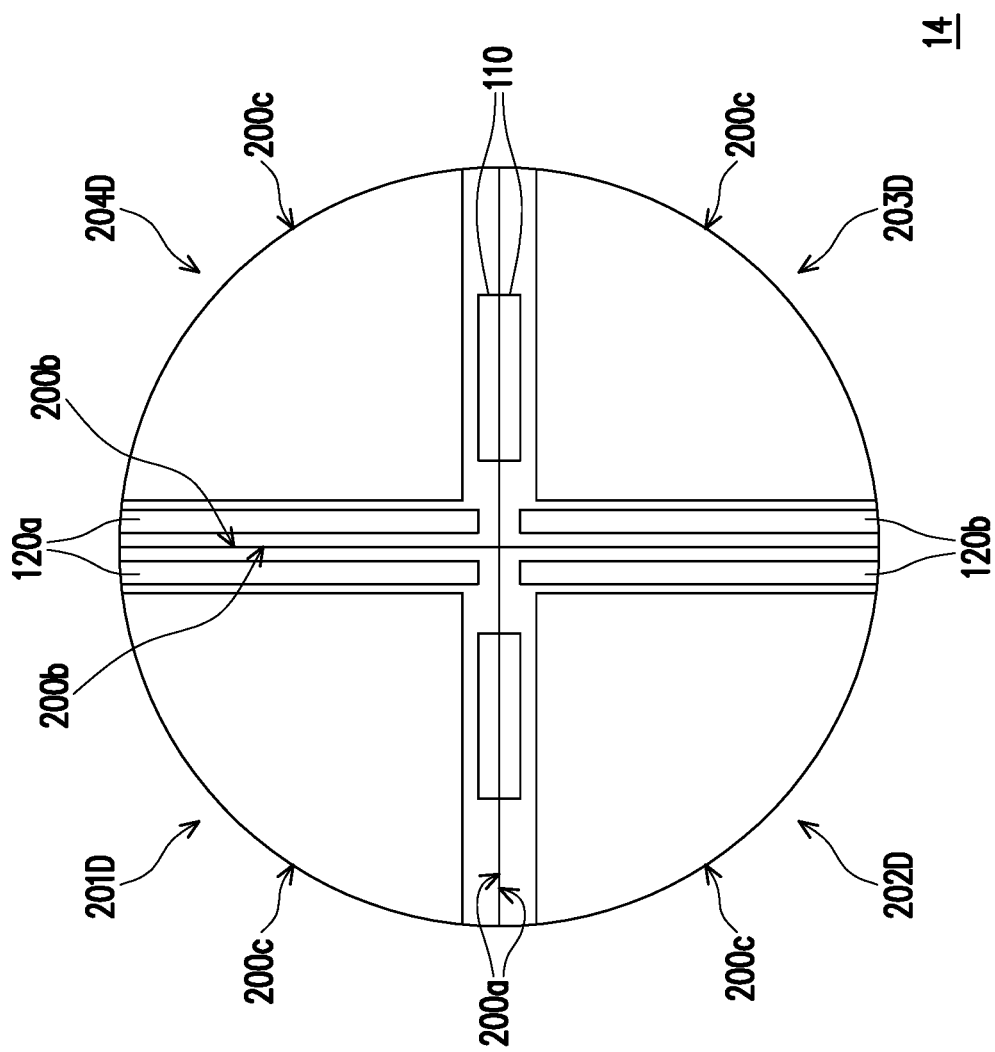
FIG. 9 is a schematic diagram illustrating a tiling display apparatus according to the fifth embodiment of the invention.

FIG. 8 is a schematic diagram illustrating a display panel which is not cut according to a fifth embodiment of the invention. FIG. 9 is a schematic diagram illustrating a tiling display apparatus according to the fifth embodiment of the invention. Referring to FIG. 8 and FIG. 9, the main difference between a tiling display apparatus 14 of the present embodiment and the tiling display apparatus 12 illustrated in FIG. 5 lies in outer contours of the cutting edges of the sub-display portions are different. To be detailed, during a process of fabricating the tiling display apparatus 14, the display panel 100 has four cutting paths CP-C, each of the cutting paths CP-C (or the cutting edges 200c of a first sub-display portion 201D to a fourth sub-display portion 204D) may have a curved line segment, and the curved line segment may be a part of a circular path. Therefore, the tiling display apparatus 14 is formed by splicing the first sub-display portion 201D to the fourth sub-display portion 204D, and an outer contour thereof may be substantially a circular shape. Nevertheless, the invention is not limited thereto. According to other embodiments, the outer contour of the tiling display apparatus may also be an elliptic shape. In other words, during a process of fabricating the tiling display apparatus, each of the cutting paths of the display panel may also be a part of an elliptic path.

It should be specially mentioned that an end point of each of the cutting paths CP-C located on the first side 100a (or the third side 100c) has a spacing S1 and a spacing S2 from two adjacent first driving circuits 110. In the present embodiment, the spacing S1 substantially may be equal to the spacing S2. Namely, the end point of the cutting path CP-C located on the first side 100a may be located right in the middle of the two adjacent first driving circuits 110 (as illustrated in FIG. 8). In this way, it may facilitate sub-display portion maximization for the first sub-display portion 201D to the fourth sub-display portion 204D. Nevertheless, the invention is not limited thereto, and according to other embodiments, the spacing S1 between the end point of each of the cutting paths located on the first side 100a (or the third side 100c) and one of the two adjacent first driving circuits 110 may also be smaller than the spacing S2 between the end point of the cutting path located on the first side 100a and another one of the two adjacent first driving circuits 110 (as illustrated in FIG. 4 and FIG. 6). In other words, a position of the end point of each of the cutting paths located on any side of the display panel 100 actually may be adjusted according to a condition that signal lines for driving display pixels are arranged in a peripheral area PA, such that the first sub-display portion 201D to the fourth sub-display portion 204D after the cutting may achieve sub-display portion maximization.

Based on the above, in the display apparatus of one of the embodiments of the invention, the size and the outer contour of the tiling display apparatus can achieve a great diversity through a splicing relation among the plurality of sub-display portions. On the other hand, each of the sub-display portions can be disposed with the driving circuits and thus, can be separately driven, which can contribute to increasing a degree of splicing freedom, so as to improve the appearance design margin of the tiling display apparatus. The replacement can be performed on only the sub-display portion that fails to be enabled during the maintenance of the tiling display apparatus, hereby improving convenience of the maintenance and reducing maintenance costs. Additionally, in the method of fabricating the tiling display apparatus of one of the embodiments of the invention, the cutting paths of the display panel extend from a side of the display panel to another side, such that the total length of the cutting paths of the display panel can be reduced, and the risk that the circuit damage or electrical short occurs to the sub-display portions can be mitigated, which can contribute to enhancing the production yield of the tiling display apparatus.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. A tiling display apparatus, comprising: a first sub-display portion and a second sub-display portion, each of the first sub-display portion and the second sub-display portion having a first subsidiary side and a second subsidiary side connected to and perpendicular to the first subsidiary side, wherein the first subsidiary side of the first sub-display portion is disposed with a first driving circuit, the first subsidiary side of the second sub-display portion is disposed with another first driving circuit, the second subsidiary side of the first sub-display portion is disposed with a second driving circuit, and the second subsidiary side of the second sub-display portion is disposed with another second driving circuit, wherein the first subsidiary side of the first sub-display portion or/and the second subsidiary side of the first sub-display portion does not belong to an outer contour of the tiling display apparatus, the first subsidiary side of the second sub-display portion or/and the second subsidiary side of the second sub-display portion does not belong to the outer contour of the tiling display apparatus, and the first subsidiary side of the first sub-display portion is spliced to the first subsidiary side of the second sub-display portion; and each of the first sub-display portion and the second sub-display portion has a cutting edge, wherein the cutting edge of the first sub-display portion is connected to at least one of the first subsidiary side of the first sub-display portion and the second subsidiary side of the first sub-display portion, and the cutting edge of the second sub-display portion is connected to at least one of the first subsidiary side of the second sub-display portion and the second subsidiary side of the second sub-display portion; and the first and second sub-display portions output an image by the first and second driving circuits.

2. The tiling display apparatus according to claim 1, further comprising:
  a third sub-display portion, wherein the third sub-display portion has a first subsidiary side and a second subsidiary side connected to and perpendicular to the first subsidiary side, wherein the second subsidiary side of the third sub-display portion is disposed with yet another second driving circuit, and the second subsidiary side of the third sub-display portion is spliced to the second subsidiary side of the second sub-display portion.

3. The tiling display apparatus according to claim 1, further comprising:
  a third sub-display portion, wherein the third sub-display portion has a cutting edge, a first subsidiary side and a second subsidiary side connected to and perpendicular to the first subsidiary side,
  wherein the cutting edge of the third sub-display portion is spliced to the cutting edge of the second sub-display portion.

4. The tiling display apparatus according to claim 1, wherein each of the cutting edge of the first sub-display portion and the cutting edge of the second sub-display portion has at least one straight line segment.

5. The tiling display apparatus according to claim 1, wherein each of the cutting edge of the first sub-display portion and the cutting edge of the second sub-display portion has at least one curved line segment.

6. The tiling display apparatus according to claim 1, wherein each of the first sub-display portion and the second sub-display portion further has a third subsidiary side, wherein the cutting edge of the first sub-display portion is connected to the first subsidiary side of the first sub-display portion and the third subsidiary side of the first sub-display portion, and the cutting edge of the second sub-display portion is connected to the first subsidiary side of the second sub-display portion and the third subsidiary side of the second sub-display portion.

7. The tiling display apparatus according to claim 6, wherein the third subsidiary side of the first sub-display portion is disposed with a third driving circuit, and the third subsidiary side of the second sub-display portion is disposed with another third driving circuit, wherein each of the first driving circuit and the another first driving circuit comprises a flexible circuit board, and each of the third driving circuit and the another third driving circuit comprises a flexible circuit board.

8. The tiling display apparatus according to claim 1, wherein each of the first driving circuit and the another first driving circuit comprises a flexible circuit board, and each of the second driving circuit and the another second driving circuit comprises a gate driver-on-array (GOA) circuit or a gate driver IC.

9. A method of fabricating a tiling display apparatus, comprising: cutting at least one display panel to form a first sub-display portion and a second sub-display portion, wherein each of the first sub-display portion and the second sub-display portion has a first subsidiary side and a second subsidiary side connected to and perpendicular to the first subsidiary side; and performing a splicing step, which comprises splicing the first subsidiary side of the first sub-display portion to the first subsidiary side of the second sub-display portion, wherein the first subsidiary side of the first sub-display portion is disposed with a first driving circuit, the first subsidiary side of the second sub-display portion is disposed with another first driving circuit, the second subsidiary side of the first sub-display portion is disposed with a second driving circuit, and the second subsidiary side of the second sub-display portion is disposed with another second driving circuit; and wherein the first sub-display portion and the second sub-display portion belong to the same display panel, the same display panel has a first side, a second side and a third side, the second side is connected between the first side and the third side, and the second side is perpendicular to the first side and the third side, wherein the step of cutting the at least one display panel to form the first sub-display portion and the second sub-display portion comprises: cutting the same display panel along a first cutting path to form the first sub-display portion, wherein the first cutting path intersects the first side and the second side; and cutting the same display panel along a second cutting path to form the second sub-display portion, wherein the second cutting path intersects the second side and the third side; and the first and second sub-display portions output an image by the first and second driving circuits.

10. The method of fabricating the tiling display apparatus according to claim 9, wherein each of the first cutting path and the second cutting path has at least one straight line segment.

11. The method of fabricating the tiling display apparatus according to claim 9, wherein each of the first cutting path and the second cutting path has at least one curved line segment.

12. The method of fabricating the tiling display apparatus according to claim 9, wherein the first sub-display portion and the second sub-display portion belong to the same display panel, the same display panel has a first side, a second side and a third side, the second side is connected between the first side and the third side, and the second side is perpendicular to the first side and the third side, wherein the step of cutting the at least one display panel to form the first sub-display portion and the second sub-display portion comprises:
  cutting the same display panel along a first cutting path to form the first sub-display portion, wherein the first sub-display portion is pentagonal, wherein the first cutting path intersects the first side and the third side, and the first cutting path comprises a bending line; and
  cutting the same display panel along a second cutting path to form the second sub-display portion, and the second sub-display portion is pentagonal, wherein the second cutting path intersects the first side and the third side, and the second cutting path comprises a bending line.

13. The method of fabricating the tiling display apparatus according to claim 9, wherein the first sub-display portion and the second sub-display portion belong to different display panels.

14. The method of fabricating the tiling display apparatus according to claim 9, wherein the first sub-display portion further has a cutting edge, and the cutting edge of the first sub-display portion is connected to at least one of the first subsidiary side of the first sub-display portion and the second subsidiary side of the first sub-display portion, wherein the splicing step further comprises:
  splicing the cutting edge of the first sub-display portion to a cutting edge of a third sub-display portion, wherein the cutting edge of the third sub-display portion is connected to at least one of a first subsidiary side of the third sub-display portion and a second subsidiary side of the third sub-display portion, and the first subsidiary side of the third sub-display portion is connected to and perpendicular to the second subsidiary side of the third sub-display portion.

\* \* \* \* \*